(12) United States Patent
Chen et al.

(10) Patent No.: US 9,773,917 B2
(45) Date of Patent: Sep. 26, 2017

(54) THIN FILM TRANSISTOR AND MANUFACTURING METHOD THEREOF, DISPLAY SUBSTRATE AND DISPLAY DEVICE

(71) Applicant: BOE TECHNOLOGY GROUP CO., LTD., Beijing (CN)

(72) Inventors: Jiangbo Chen, Beijing (CN); Dongfang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/651,376

(22) PCT Filed: Oct. 30, 2014

(86) PCT No.: PCT/CN2014/089900
§ 371 (c)(1),
(2) Date: Jun. 11, 2015

(87) PCT Pub. No.: WO2015/169069
PCT Pub. Date: Nov. 12, 2015

(65) Prior Publication Data
US 2016/0260834 A1    Sep. 8, 2016

(30) Foreign Application Priority Data

May 7, 2014    (CN) .......................... 2014 1 0190720

(51) Int. Cl.
*H01L 21/00*    (2006.01)
*H01L 21/16*    (2006.01)
(Continued)

(52) U.S. Cl.
CPC .......... *H01L 29/7869* (2013.01); *C23C 14/08* (2013.01); *C23C 14/086* (2013.01);
(Continued)

(58) Field of Classification Search
CPC ................................................... H01L 29/7869
(Continued)

(56) References Cited

U.S. PATENT DOCUMENTS 8,405,085 B2    3/2013    Wu et al.
8,795,554 B2    8/2014    Yano et al.
(Continued)

FOREIGN PATENT DOCUMENTS

CN    102131953 A    7/2011
CN    102184967 A    9/2011
(Continued)

OTHER PUBLICATIONS

International Search Report of PCT/CN2014/089900 in Chinese, mailed Mar. 17, 2015 with English translation.
(Continued)

*Primary Examiner* — Asok K Sarkar
*Assistant Examiner* — Igwe U Anya
(74) *Attorney, Agent, or Firm* — Collard & Roe, P.C.

(57) ABSTRACT

A thin film transistor and a manufacturing method thereof, a display substrate and a display device are provided. The method of manufacturing the thin film transistor comprises forming an active layer (4) having characteristics of crystal orientation of C-axis on a substrate (1) by using indium gallium zinc oxide ($InGaO_3(ZnO)_m$), where $m \geq 2$. The active layer fabricated with $InGaO_3(ZnO)_m$ has a good electron mobility, and the quality of the fabricated active layer is improved.

16 Claims, 2 Drawing Sheets

(51) Int. Cl.
*H01L 29/786* (2006.01)
*C23C 14/08* (2006.01)
*C23C 14/14* (2006.01)
*C23C 14/28* (2006.01)
*C23C 14/34* (2006.01)
*C23C 16/34* (2006.01)
*C23C 16/40* (2006.01)
*H01L 21/02* (2006.01)
*H01L 27/12* (2006.01)
*H01L 29/04* (2006.01)
*H01L 29/24* (2006.01)
*H01L 29/66* (2006.01)

(52) U.S. Cl.
CPC ............. *C23C 14/14* (2013.01); *C23C 14/28* (2013.01); *C23C 14/3457* (2013.01); *C23C 14/3492* (2013.01); *C23C 16/345* (2013.01); *C23C 16/401* (2013.01); *H01L 21/0217* (2013.01); *H01L 21/02164* (2013.01); *H01L 21/02274* (2013.01); *H01L 21/02472* (2013.01); *H01L 21/02483* (2013.01); *H01L 21/02554* (2013.01); *H01L 21/02565* (2013.01); *H01L 21/02631* (2013.01); *H01L 27/1225* (2013.01); *H01L 29/045* (2013.01); *H01L 29/24* (2013.01); *H01L 29/66969* (2013.01); *H01L 29/786* (2013.01); *H01L 29/78696* (2013.01)

(58) Field of Classification Search
USPC ............................................ 257/43; 438/104
See application file for complete search history.

(56) References Cited

U.S. PATENT DOCUMENTS

| | | | |
|---|---|---|---|
| 2009/0152506 A1* | 6/2009 | Umeda | C30B 1/02 252/500 |
| 2011/0156026 A1 | 6/2011 | Yamazaki et al. | |
| 2011/0284848 A1* | 11/2011 | Yamazaki | H01L 27/1225 257/57 |
| 2012/0056647 A1 | 3/2012 | Nagatsuka et al. | |
| 2012/0138922 A1* | 6/2012 | Yamazaki | H01L 29/7869 257/43 |
| 2012/0312681 A1 | 12/2012 | Yamazaki et al. | |
| 2015/0295092 A1* | 10/2015 | Misaki | G02F 1/1368 257/43 |

FOREIGN PATENT DOCUMENTS

| | | | | |
|---|---|---|---|---|
| CN | 102903758 A | | 1/2013 | |
| CN | 103124805 A | | 5/2013 | |
| JP | WO 2014054428 A1 | * | 4/2014 | ........... G02F 1/1368 |

OTHER PUBLICATIONS

Notice of Transmittal of the International Search Report of PCT/CN2014/089900 in Chinese, mailed Mar. 17, 2015.
Written Opinion of the International Searching Authority of PCT/CN2014/089900, mailed Mar. 17, 2015 with English translation.
Dong Kyu Seo et al. Composition Controlled Superlattice InGaO3(ZnO)m Thin Films by Thickness of ZnO Buffer Layers and Thermal Treatment. Crystal Growth & Design, Aug. 9, 2010 (Aug. 9, 2010), issue 10, vol. 10, pp. 4638-4641.
First Chinese Office Action in Chinese Application No. 201410190720.9 dated Jan. 21, 2015 with English translation.

* cited by examiner

# THIN FILM TRANSISTOR AND MANUFACTURING METHOD THEREOF, DISPLAY SUBSTRATE AND DISPLAY DEVICE

CROSS REFERENCE TO RELATED APPLICATIONS

This application is the National Stage of PCT/CN2014/089900 filed on Oct. 30, 2014, which claims priority under 35 U.S.C. §119 of Chinese Application No. 201410190720.9 filed on May 7, 2014, the disclosure of which is incorporated by reference.

TECHNICAL FIELD

Embodiments of the present invention relate to a thin film transistor and a manufacturing method thereof, a display substrate and a display device.

BACKGROUND

Oxide transistors attract wide attention due to their high mobility and good compatibility with the a-Si production line. However, since the oxide transistor having an etch stop layer (ESL) has a disadvantage of complex processes and less competitiveness with respect to a-Si, it is important to develop a back channel etch (BCE) oxide thin film transistor (e.g. indium gallium zinc oxide).

SUMMARY

The embodiments of the present invention provide a thin film transistor and a manufacturing method thereof, a display substrate and a display device.

At least one embodiment of the present invention provides a method of manufacturing a thin film transistor. The method comprises forming an active layer having characteristics of crystal orientation of C-axis on a substrate by using $InGaO_3(ZnO)_m$, where $m \geq 2$.

In an example, the active layer is formed by depositing indium gallium zinc oxide layer at least two times on the substrate.

In an example, during forming the active layer having characteristics of crystal orientation of C-axis by using indium gallium zinc oxide ($InGaO_3(ZnO)_m$), a first indium gallium zinc oxide layer with C-axis orientation is deposited via a physical vapor deposition process under a first power and a first speed; a second indium gallium zinc oxide layer is deposited on the formed first indium gallium zinc oxide layer via a physical vapor deposition manner under a second power and a second speed; the first indium gallium zinc oxide layer and the second indium gallium zinc oxide layer form the active layer, wherein the first power is smaller than the second power, and the first speed is smaller than the second speed.

In an example, both the first indium gallium zinc oxide layer and the second indium gallium zinc oxide layer are formed at a temperature of 200° C.-400° C.

In an example, the active layer is formed in vacuum by using a Nd: YAG laser, wherein the laser has an output wavelength of 193-1064 nm, a repetition frequency larger than 1 Hz, and a pulse width less than 10 ns.

In an example, the active layer is formed in vacuum by using a Nd: YAG laser, wherein the laser has an output wavelength of 1064 nm, a repetition frequency of 10 Hz, and a pulse width of 10 ns.

In an example, the first power is a power before the laser focuses, which is 0.2-0.4 W.

In an example, the first power is a power before the laser focuses, which is 0.3 W.

In an example, the first indium gallium zinc oxide layer is deposited for 10-30 s, the formed first indium gallium zinc oxide layer has a thickness of d, where $0 \leq d \leq 10$ nm.

In an example, the second power is a power before the laser focuses, which is 0.5-1.0 W.

In an example, the second power is a power before the laser focuses, which is 0.5 W.

In an example, the first indium gallium zinc oxide layer and the second indium gallium zinc oxide layer are formed by a sputtering process in vacuum.

In an example, when the sputtering process is performed in vacuum, oxygen and argon gas are input into a vacuum chamber, wherein a ratio of the oxygen and the argon gas is 1:4.

In an example, the first indium gallium zinc oxide layer is formed by one scanning under a condition that the first power is 2-3 KW and a flow of oxygen is 25 standard ml/min; and the second indium gallium zinc oxide layer is formed by one scanning under a condition that the second power is 4-6 KW and a flow of oxygen is 25 standard ml/min.

In an example, the first indium gallium zinc oxide layer is formed by one scanning under a condition that the first power is 3 KW and a flow of oxygen is 25 standard ml/min; and the second indium gallium zinc oxide layer is formed by one scanning under a condition that the second power is 4.5 KW and a flow of oxygen is 25 standard ml/min.

In an example, the indium gallium zinc oxide ($InGaO_3(ZnO)_m$) comprises any one of $InGaZn_2O_5$, $InGaZn_3O_6$, $InGaZn_4O_7$, $InGaZn_5O_8$ or $InGaZn_6O_9$.

In an example, the active layer is divided into three layers deposited on the substrate, wherein a growth speed of each of indium gallium zinc oxide layers is incrementally increased.

At least one embodiment of the present invention provides a thin film transistor, the thin film transistor comprises an active layer provided on a substrate, wherein the active layer comprises an indium gallium zinc oxide having characteristics of crystal orientation of C-axis, the indium gallium zinc oxide is $InGaO_3(ZnO)_m$, where $m \geq 2$.

In an example, the indium gallium zinc oxide ($InGaO_3(ZnO)_m$) comprises any one of $InGaZn_2O_5$, $InGaZn_3O_6$, $InGaZn_4O_7$, $InGaZn_5O_8$ or $InGaZn_6O_9$.

At least one embodiment of the present invention also provides a display substrate, the display substrate comprises a substrate and a thin film transistor provided on the substrate.

At least one embodiment of the present invention also provides a display device, the display device comprises the above display substrate.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

Figure 1:
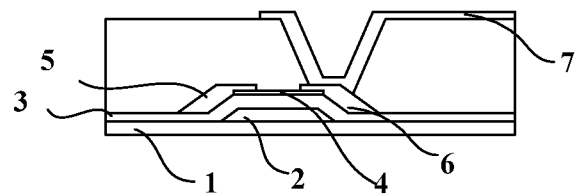
FIG. 1 is a schematic structural view of a display substrate provided by an embodiment of the present invention.

The technical solutions of the embodiments of the present disclosure will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects stated and equivalents thereof listed after these terms, but not preclude other elements or objects. The terms, "on," "under," or the like are only used to indicate relative position relationship, and when the position of the object which is described is changed, the relative position relationship may be changed accordingly.

The inventor notices that in the procedure of manufacturing thin film oxide transistors, since the indium gallium zinc oxide has a high crystallization temperature, and InGaZnO4 is used as target composition to fabricate the commonly used indium gallium zinc oxide semiconductor thin film transistor devices and backplanes, the sample deposited by using this target composition is not easily crystallized, and the substrate still cannot be crystallized even when the substrate is heated up to 500 degrees. The process requirement of the method is higher, thereby it affects production efficiency and stability of the thin film transistor.

In order to improve the production efficiency and stability of thin film transistors, embodiments of the present invention provide a thin film transistor and a manufacturing method thereof, a display substrate and a display device. In the technical solution of at least one embodiment of the invention, the active layer having characteristics of crystal orientation of C-axis is formed by using indium gallium zinc oxide (InGaO$_3$(ZnO)$_m$), the method changes the content of zinc in the existing target composition, reduces the crystallization temperature of the indium gallium zinc oxide, and improves the stability of the bias test of the thin film transistor. The crystallized indium gallium zinc oxide sample has an etching speed in the source electrode and drain electrode etching liquid several times smaller than that of the un-crystallized indium gallium zinc oxide sample, and it can realize precise control to the etching. This material property allows the thin film transistor to use a back channel etching type structure, which reduces processes of manufacturing an etch stop layer. Furthermore, the active layer formed with InGaO$_3$(ZnO)$_m$ has a good electron mobility, and the quality of the fabricated active layer is improved, so that the quality of the display device is improved.

The embodiment of the present invention provides a method of manufacturing a thin film transistor, the method comprises the following steps.

An active layer having characteristics of crystal orientation of C-axis is formed on a substrate by using indium gallium zinc oxide (InGaO$_3$(ZnO)$_m$), where m≥2.

The C axis crystal orientation is that X axis is in the horizontal direction, Y axis is perpendicular to the X axis, Z axis is perpendicular to a plane defined by the X axis and the Y axis, C axis orientation is the circular motion along the Z axis. In the above method, the active layer having characteristics of crystal orientation of C-axis is formed by using indium gallium zinc oxide, the method changes the content of zinc in the existing target composition, reduces the crystallization temperature of the indium gallium zinc oxide, and improves the stability of the bias test of the thin film transistor. The crystallized indium gallium zinc oxide sample has an etching speed in the source electrode and drain electrode etching liquid several times smaller than that of the un-crystallized indium gallium zinc oxide sample, and it can realize a precise control to the etching. The material property allows the thin film transistor to use a back channel etching type structure, which reduces processes of manufacturing an etch stop layer. Furthermore, the active layer formed with InGaO$_3$(ZnO)$_m$ has a good electron mobility, and the quality of the fabricated active layer is improved.

The indium gallium zinc oxide (InGaO$_3$(ZnO)$_m$) can be, for example, any one of InGaZn$_2$O$_5$, InGaZn$_3$O$_6$, InGaZn$_4$O$_7$, InGaZn$_5$O$_8$ or InGaZn$_6$O$_9$. Since the active layer formed with such indium gallium zinc oxide has a low crystallization temperature, which can be crystallized under a temperature of 200-400° C., and it efficiently reduces the crystallization temperature of the indium gallium zinc oxide.

In an example, in a procedure of forming the active layer having characteristics of crystal orientation of C-axis by using InGaO$_3$(ZnO)$_m$, a first indium gallium zinc oxide layer with C axis orientation is deposited via a physical vapor deposition process under a first power and a first speed.

A second indium gallium zinc oxide layer is deposited on the formed first indium gallium zinc oxide layer via a physical vapor deposition process under a second power and a second speed. The first indium gallium zinc oxide layer and the second indium gallium zinc oxide layer form the active layer. The first power is smaller than the second power, and the first speed is smaller than the second speed.

The first indium gallium zinc oxide layer is formed by slow deposition. Since the deposition speed is slow, the first indium gallium zinc oxide layer has a better crystallization effect. In a subsequent procedure of quickly forming the second indium gallium zinc oxide layer, the first indium gallium zinc oxide layer can act as a crystal nucleus of the second indium gallium zinc oxide layer, therefore, it can improve crystallization rate of the second indium gallium zinc oxide layer, thereby improve production efficiency of the active layer, and allow the produced active layer to have characteristics of crystal orientation of C-axis.

For example, both the first indium gallium zinc oxide layer and the second indium gallium zinc oxide layer are formed under a temperature of 200-400° C. Therefore, compared with a general technology, the crystallization temperature of the indium gallium zinc oxide is reduced.

Under a condition of a physical deposition process being used to form the active layer, different process methods can be used.

For example, by using a process of laser pulse, a first indium gallium zinc oxide layer with characteristics of crystal orientation of C-axis is deposited under a first power and a first speed; a second indium gallium zinc oxide layer is deposited on the formed first indium gallium zinc oxide layer under a second power and a second speed; and the first indium gallium zinc oxide layer and the second indium gallium zinc oxide layer form the active layer.

For example, the active layer is formed by using a Nd:YAG laser. The laser has an output wavelength of 193-1064 nm, for example, 1064 nm, a repetition frequency larger than 1 Hz, for example, 10 Hz, and a pulse width less than or equal to 10 ns.

In the fabrication procedure, firstly, a mechanical pump of a vacuum system is opened to evacuate a vacuum chamber. When the vacuum reaches up to 0-5 Pa, a molecular pump is opened to continue the evacuating operation.

When the vacuum reaches up to $2.5 \times 10^{-4}$ Pa, the molecular pump is closed, the mechanical pump is opened to input the oxygen into the vacuum chamber and keep the oxygen pressure at 10.0 Pa.

During depositing, the laser uses a first power of 0.2-0.4 W before the it focuses, for example, 0.3 W; the indium gallium zinc oxide layer is deposited at a temperature of 200-400 celsius degrees, and a deposition time is 10-30 s. The first indium gallium zinc oxide layer is deposited under a first speed, and the formed first indium gallium zinc oxide layer has a thickness of d, where $0 \le d \le 10$ nm.

Then, the oxygen flow is reduced to keep the vacuum chamber pressure at 5.0 Pa; the laser uses a second power of 0.5-1.0 W before it focuses, for example, 0.5 W; the second indium gallium zinc oxide layer is deposited on the first indium gallium zinc oxide layer under a second deposition speed so as to form the active layer.

Alternatively, the active layer can be formed by using a sputtering process.

In an example, when the vacuum reaches up to $2.5 \times 10^{-4}$ Pa, an indium gallium zinc oxide film begins to be deposited, wherein the deposition temperature is kept at 200-400 celsius degrees, and oxygen and argon gas are input into the vacuum chamber at a ratio 1:4.

Since the deposition is performed by using a first power of 2-3 KW, for example, 3 KW, an oxygen flow of 25 standard ml/min and one scanning, so that the indium gallium zinc oxide forms the first indium gallium zinc oxide layer at the first speed.

The second indium gallium zinc oxide layer is deposited on the deposited first indium gallium zinc oxide layer, wherein the deposition is performed by using an increased power, a second power of 4-6 KW, for example, 4.5 KW, an oxygen flow of 25 standard ml/min and one scanning, so that the required film thickness is reached to form the active layer.

In embodiments of the present invention, two layers of indium gallium zinc oxide are formed by using different process conditions; the first indium gallium zinc oxide layer is formed by slow deposition; since the deposition speed is slow, the first indium gallium zinc oxide layer has a better crystallization effect. In the subsequent procedure of quickly forming the second indium gallium zinc oxide layer, the first indium gallium zinc oxide layer can act as crystal nucleus of the second indium gallium zinc oxide layer, therefore, it can improve crystallization rate of the second indium gallium zinc oxide layer, thereby improve production efficiency of the active layer, and allow the produced active layer to have characteristics of crystal orientation of C-axis. The crystallized $InGaO_3(ZnO)_m$ sample has an etching speed in the source electrode and drain electrode etching liquid several times smaller than that of the un-crystallized indium gallium zinc oxide sample, and it can realize a precise to control the etching. A back channel etching type structure of thin film transistor requires the etching liquid to have different etch selectivity for the active layer and the source-drain electrode layer, otherwise the channel would be damaged or even be etched away in the procedure of patterning the source-drain layer. In embodiments of the present invention, the crystallized $InGaO_3(ZnO)_m$ sample is less affected by the source-drain etching liquid than the amorphous indium gallium zinc oxide, such a property allows the thin film transistor to use a back channel etching type structure. Compared with the etch stop layer type of thin film transistor, it can save separate patterning processes of the etch stop layer, simplify the procedures of manufacturing the oxide thin film transistor and save the production cost.

FIGS. 2a-2d are flow diagrams of manufacturing a thin film transistor structure provided by an embodiment of the present invention. The method of manufacturing the thin film transistor provided by the embodiment of the present invention will be described in details hereinafter in conjunction with FIGS. 2a-2d.

Step 1, a transparent substrate 1 is cleaned by using a standard method.

Figure 2A:
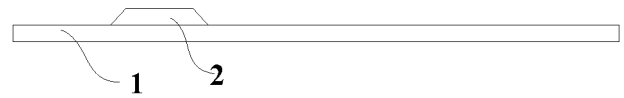
FIGS. 2(a)-2(d) are flow diagrams of manufacturing a thin film transistor structure provided by an embodiment of the present invention.

Step 2, as shown in FIG. 2a, a gate electrode 2 is formed on the transparent substrate 1.

For example, a gate metal layer having a thickness of 50-400 nm is deposited by using a sputtering or evaporation process, and the gate metal layer is patterned to form the gate electrode 2.

Figure 2B:
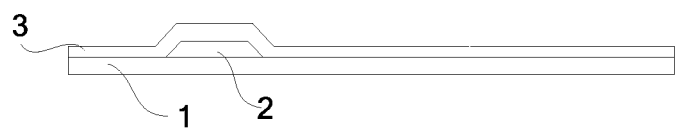

Step 3, as shown in FIG. 2b, a gate insulating layer 3 is formed on the gate electrode 2.

For example, a $SiN_x$ or $SiO_x$ gate insulating layer 3 having a thickness of 100-500 nm is formed by using a plasma enhanced chemical vapor deposition process, where x is nature number.

Figure 2C:
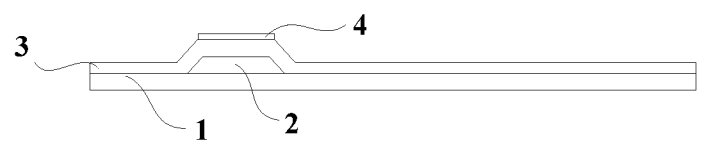

Step 4, as shown in FIG. 2c, an active layer 4 having characteristics of crystal orientation of C-axis is fabricated by using indium gallium zinc oxide ($InGaO_3(ZnO)_m$), where $m \ge 2$.

For example, a first indium gallium zinc oxide layer with C axis orientation is deposited via a physical vapor deposition process under a first power and a first speed.

A second indium gallium zinc oxide layer is deposited on the formed first indium gallium zinc oxide layer via a physical vapor deposition process under a second power and a second speed, wherein the first indium gallium zinc oxide layer and the second indium gallium zinc oxide layer form the active layer 4, the first power is smaller than the second power, and the first speed is smaller than the second speed.

The physical vapor deposition process can be a sputtering or a laser pulse process.

1) The laser pulse process: the used laser system is Nd:YAG pulse laser, wherein the laser has an output wavelength of 193-1064 nm, for example, 1064 nm, a repetition frequency larger than 1 Hz, for example, 10 Hz, a pulse width less than 10 ns. The embodiments of the present invention use the third harmonics of the laser (of which wavelength is 355 nm). Firstly, a mechanical pump of a vacuum system is opened to evacuate a vacuum chamber. When the vacuum reaches up to 0-5 Pa, a molecular pump is opened to continue the evacuating operation. When the vacuum reaches up to $2.5 \times 10^{-4}$ Pa, the molecular pump is closed, the mechanical pump is opened to input the oxygen into the vacuum chamber and keep the oxygen pressure at 10.0 Pa. During the depositing, the laser has an average power of 0.2-0.4 W before it focuses, for example, 0.3 W. The indium gallium zinc oxide layer is deposited at a temperature of 200-400 degrees for 10-30 s; the indium gallium zinc oxide layer having a thickness of 0-10 nm of is formed, that is, a fist indium gallium zinc oxide layer is formed. The first indium gallium zinc oxide layer acts as a seed crystal to improve the crystallization property. Then, the oxygen flow is reduced to keep the vacuum chamber pressure at 5.0 Pa; the laser has an average power of 0.5-1.0 W before it focuses, for example, 0.5 W; the second indium gallium zinc oxide layer is deposited on the first indium gallium zinc oxide layer to reach the required thickness so as to form the active layer.

2) The sputtering process, when the vacuum reaches up to $2.5 \times 10^{-4}$ Pa, it begins to deposit an indium gallium zinc oxide film, wherein the deposition temperature is kept at 200-400 degrees, oxygen and argon gas are input into the vacuum chamber at a ratio of 1:4.

The deposition is performed by using a first power of 2-3 KW, for example, 3 KW, an oxygen flow of 25 standard ml/min and one scanning, so that the indium gallium zinc oxide forms the first indium gallium zinc oxide layer at the first speed.

The second indium gallium zinc oxide layer is deposited on the deposited first indium gallium zinc oxide layer, wherein the deposition is performed by using an increased power of 4-6 KW, for example, 4.5 KW, that is, a second power, an oxygen flow of 25 standard ml/min and one scanning, so that the required film thickness is reached to form the active layer.

After the active layer of the indium gallium zinc oxide is formed by performing deposition, a pattern of the active layer 4 is finally formed by a pattern process.

Figure 2D:
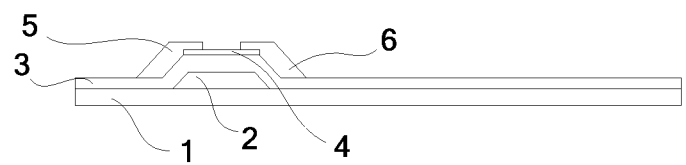

Step 5, as shown in FIG. 2d, a source electrode 5 and a drain electrode 6 are formed.

For example, the source electrode 5 and the drain electrode 6 having a thickness of 50-400 nm are formed by using molybdenum, aluminum, aluminum neodymium alloy, copper or the like via a sputtering process, and a lithographic or etching process is performed according to the required pattern.

As can be seen from above embodiments, the method provided by the embodiments of the present invention uses indium gallium zinc oxide (InGaO$_3$(ZnO)$_m$) to form the active layer 4 having characteristics of crystal orientation of C-axis, where m≥2, it reduces the crystallization temperature of the indium gallium zinc oxide, and improves the stability of the formed active layer 4. Furthermore, the active layer 4 formed with InGaO$_3$(ZnO)$_m$ has a good electron mobility.

During the display substrate is fabricated, in addition to the above steps of manufacturing the thin film transistors, according to the requirements, the method further comprises forming other structures configured to perform display in the display substrate, such as a pixel electrode, a pixel defining layer, an anode and the like. The present invention is not intended to limit the structure of the display substrate. As shown in FIG. 1, the display substrate provided by embodiments of the present invention can comprise a pixel electrode 7 connected with a drain electrode 6 by a via hole.

In other embodiments of the present invention, the active layer can be formed by being divided into three or more layers, wherein the growth speed of each layer of indium gallium zinc oxide InGaO$_3$(ZnO)$_m$ is incrementally increased, and the power of the laser or the sputtering device used to perform deposition is correspondingly changed to obtain required active layer.

The method of manufacturing the thin film transistor according to embodiments of the present invention uses indium gallium zinc oxide (InGaO$_3$(ZnO)$_m$) to form the active layer having characteristics of crystal orientation of C-axis. The method changes the content of zinc in the existing target composition, reduces the crystallization temperature of the indium gallium zinc oxide, and improves the stability of the bias test of the thin film transistor. The crystallized indium gallium zinc oxide sample has an etching speed in the source electrode and drain electrode etching liquid several times smaller than that of the un-crystallized indium gallium zinc oxide sample, and it can precisely control the etching. That is, the material property of the active layer allows the thin film transistor to use a back channel etching type structure, which reduces separate processes of manufacturing the etch stop layer, and simplifies the procedures of manufacturing the oxide thin film transistor and saves the production cost. Furthermore, the active layer fabricated with InGaO$_3$(ZnO)$_m$ has a good electron mobility and the quality of the fabricated active layer is improved.

As shown in FIG. 2d, the embodiment of the present invention provide a thin film transistor. The thin film transistor comprises an active layer 4 disposed on a substrate 1, wherein the active layer 4 is a film layer having characteristics of crystal orientation of C-axis formed by indium gallium zinc oxide (InGaO$_3$(ZnO)$_m$), where m≥2.

In the embodiment of the present invention, the indium gallium zinc oxide is InGaO$_3$(ZnO)$_m$, where m≥2. Therefore, the indium gallium zinc oxide used to fabricate the active layer 4 can be made of different materials, for example, the above InGaO$_3$(ZnO)$_m$ can be any one of InGaZn$_2$O$_5$, InGaZn$_3$O$_6$, InGaZn$_4$O$_7$, InGaZn$_5$O$_8$ or InGaZn$_6$O$_9$. Compared with the target composition in general technology, the content of zinc in such material is changed, and it finally reduces the crystallization temperature of the oxide active layer. Furthermore, the active layer 4 formed with InGaO$_3$(ZnO)$_m$ has a good electron mobility and the quality of the active layer 4 is improved. Furthermore, the crystallized indium gallium zinc oxide sample has an etching speed in the source electrode and drain electrode etching liquid several times smaller than that of the un-crystallized indium gallium zinc oxide sample, and it can precisely control the etching. It should be understood that the indium gallium zinc oxide provided by embodiments of the present invention is not limited to the listed in above particular embodiments, any indium gallium zinc oxide that meets InGaO$_3$(ZnO)$_m$, where m can be used in the embodiments.

Continue to refer to FIG. 2d, the thin film transistor provided by the embodiment of the present invention further comprises a gate electrode 2 and a gate insulating layer 3 disposed between the gate electrode 2 and the active layer 4. The thin film transistor provided by the embodiment of the present invention comprises the gate electrode 2, the gate insulating layer 3 disposed on the gate electrode 2, the active layer 4 disposed on the gate insulating layer 3 and the source electrode 5 and the drain electrode 6 respectively connected with two ends of the active layer 4, wherein the source electrode 5, the drain electrode 6 and the active layer 4 form a back channel etching type structure. The back channel etching type structure omits the etch stop layer on the active layer. The thin film transistor has a simple structure and production process, a low production cost and high production efficiency.

In above embodiment, the indium gallium zinc oxide (InGaO$_3$(ZnO)$_m$) is used to form the active layer 4, and it changes the content of zinc in the existing target composition, reduces the crystallization temperature of the indium gallium zinc oxide, and improves the stability of the active layer 4. Furthermore, the active layer 4 fabricated with InGaO$_3$(ZnO)$_m$ has a good electron mobility, and the quality of the fabricated active layer 4 is improved. Furthermore, the crystallized indium gallium zinc oxide $(InGaO_3(ZnO)_m)$ sample has an etching speed in the source electrode and drain electrode etching liquid several times smaller than that of the un-crystallized indium gallium zinc oxide sample, and it can precisely control the etching. The back channel etching type structure of thin film transistor requires the etching liquid to have different etch selectivity for the active layer and the source-drain electrode layer, otherwise the channel would be damaged or even be etched away in the procedure of patterning the source-drain layer. In embodiments of the present invention, the crystallized $InGaO_3(ZnO)_m$ sample is less affected by the source-drain etching liquid than the amorphous indium gallium zinc oxide, such a property allows the thin film transistor to use a back channel etching type structure. Compared with the etch stop layer type of thin film transistor, it can save separate patterning processes of the etch stop layer, simplify the procedures of manufacturing the oxide thin film transistor and save the production cost.

The embodiment of the present invention also provides a display substrate. The display substrate comprises a substrate 1 and any of above thin film transistors disposed on the substrate 1. In addition to the above thin film transistor, according to the requirements, the display substrate further comprises other structures configured to perform display, such as a pixel electrode, a pixel defining layer, an anode and the like. The present invention is not intended to limit the structure of the display substrate. As shown in FIG. 1, the display substrate provided by embodiments of the present invention can comprise a pixel electrode 7 connected with a drain electrode 6 by a via hole.

In the display substrate in the embodiment of the present invention, its thin film transistor has an active layer having characteristics of crystal orientation of C-axis formed by using indium gallium zinc oxide $(InGaO_3(ZnO)_m)$, and it changes the content of zinc in the existing target composition, reduces the crystallization temperature of the indium gallium zinc oxide, and improves the stability of the bias test of the thin film transistor. The crystallized indium gallium zinc oxide sample has an etching speed in the source electrode and drain electrode etching liquid several times smaller than that of the un-crystallized indium gallium zinc oxide sample, and it can precisely control the etching. That is, the material property allows the thin film transistor to use a back channel etching type structure, which reduces processes for forming the etch stop layer. Furthermore, the active layer formed with $InGaO_3(ZnO)_m$ has a good electron mobility, and the quality of the formed active layer is improved, thereby the quality of the display device is improved.

The embodiment of the present invention also provides a display device. The display device comprises said display substrate.

In above embodiments, the indium gallium zinc oxide $(InGaO_3 (ZnO)_m)$ is used to form the active layer 4 having characteristics of crystal orientation of C-axis, and it reduces the crystallization temperature of the indium gallium zinc oxide and thereby improves the stability of the formed active layer 4. Furthermore, the active layer 4 fabricated with $InGaO_3(ZnO)_m$ has a good electron mobility and the quality of the fabricated active layer 4 is improved, thereby the quality of the display device is improved.

It is understood that the described above are only for explaining the present invention, and it is not for limiting the present invention. For one of ordinary skill in the art, various modifications and improvements may be made without departing from the spirit and scope of embodiments of the present invention, and all of which should fall within the protection scope of the present invention. The scope protected by the present invention is defined by the claims.

The present invention claims priority of Chinese patent application No. 201410190720.9 filed on May 7, 2014 titled "Thin Film Transistor and Manufacturing Method Thereof, Display Substrate and Display Device", the entire content of which is incorporated herein by reference.

What is claimed is:

1. A method of manufacturing a thin film transistor, comprising:
    forming an active layer having characteristics of crystal orientation of C-axis on a substrate by using indium gallium zinc oxide $(InGaO_3(ZnO)_m)$, where m≥2,
    wherein the active layer is formed by depositing the indium gallium zinc oxide layer at least two times on the substrate,
    wherein in a procedure of manufacturing the active layer having characteristics of crystal orientation of C-axis by using the indium gallium zinc oxide, depositing a first indium gallium zinc oxide layer with C axis crystal orientation via a physical vapor deposition process under a first power and a first speed, and depositing a second indium gallium zinc oxide layer on the formed first indium gallium zinc oxide layer via a physical vapor deposition process under a second power and a second speed, wherein the first indium gallium zinc oxide layer and the second indium gallium zinc oxide layer forms the active layer, and
    wherein the first power is smaller than the second power, and the first speed is smaller than the second speed.

2. The method of manufacturing the thin film transistor according to claim 1, wherein both the first indium gallium zinc oxide layer and the second indium gallium zinc oxide layer are formed at a temperature of 200° C.-400° C.

3. The method of manufacturing the thin film transistor according to claim 2, wherein the active layer is formed in vacuum by using a Nd: YAG laser; and
    the laser has an output wavelength of 193-1064 nm, a repetition frequency larger than 1 Hz, and a pulse width less than 10 ns.

4. The method of manufacturing the thin film transistor according to claim 3, wherein the first power is a power before the laser focuses, which is 0.2-0.4 W.

5. The method of manufacturing the thin film transistor according to claim 2, wherein the active layer is formed in vacuum by using a Nd: YAG laser, and
    wherein the laser has an output wavelength of 1064 nm, a repetition frequency of 10 Hz, and a pulse width of 10 ns.

6. The method of manufacturing the thin film transistor according to claim 3, wherein the first power is a power before the laser focuses, which is 0.3 W.

7. The method of manufacturing the thin film transistor according to claim 1, wherein the first indium gallium zinc oxide layer is deposited for 10-30 s, and the formed first indium gallium zinc oxide layer has a thickness larger than 0 and less than or equal to 10 nm.

8. The method of manufacturing the thin film transistor according to claim 7, wherein the second power is a power before the laser focuses, which is 0.5-1.0 W.

9. The method of manufacturing the thin film transistor according to claim 7, wherein the second power is a power before the laser focuses, which is 0.5 W.

10. The method of manufacturing the thin film transistor according to claim 1, wherein the first indium gallium zinc oxide layer and the second indium gallium zinc oxide layer are formed by using a sputtering process under a condition of vacuum.

11. The method of manufacturing the thin film transistor according to claim 10, wherein when the sputtering is performed under the condition of vacuum, a mixture of oxygen gas and argon gas are input into a vacuum chamber.

12. The method of manufacturing the thin film transistor according to claim 11, wherein a ratio of oxygen gas and argon gas is 1:4.

13. The method of manufacturing the thin film transistor according to claim 12, wherein the first indium gallium zinc oxide layer is formed by one scanning under a condition that the first power is 2-3 KW and a flow of oxygen is 25 standard ml/min; and the second indium gallium zinc oxide layer is formed by one scanning under a condition that the second power is 4-6 KW and a flow of oxygen is 25 standard ml/min.

14. The method of manufacturing the thin film transistor according to claim 12, wherein the first indium gallium zinc oxide layer is formed by one scanning under a condition that the first power is 3 KW and a flow of oxygen is 25 standard ml/min; and the second indium gallium zinc oxide layer is formed by one scanning under a condition that the second power is 4.5 KW and a flow of oxygen is 25 standard ml/min.

15. The method of manufacturing the thin film transistor according to claim 1, wherein the indium gallium zinc oxide ($InGaO_3(ZnO)_m$) comprises any one of $InGaZn_2O_5$, $InGaZn_3O_6$, $InGaZn_4O_7$, $InGaZn_5O_8$ or $InGaZn_6O_9$.

16. The method of manufacturing the thin film transistor according to claim 1, wherein the active layer is divided into three layers deposited on the substrate, wherein the growth speed of each of indium gallium zinc oxide layers is incrementally increased.

* * * * *